United States Patent [19]

Owen et al.

[11] 4,057,819
[45] Nov. 8, 1977

[54] SEMICONDUCTOR DEVICE

[76] Inventors: Alan Ernest Owen, 19 Tantallon Place, Edinburgh 9, Scotland; John Mavor, 20 Ellen's Glen Road, Edinburgh EH17 7QP, Scotland

[21] Appl. No.: 711,873

[22] Filed: Aug. 5, 1976

[51] Int. Cl.² .......................................... H01L 29/78
[52] U.S. Cl. ...................................... 357/23; 357/30; 357/54; 357/8; 250/211 J
[58] Field of Search ................... 357/30, 54, 23, 8; 250/211 J

[56] References Cited

U.S. PATENT DOCUMENTS

| 3,492,549 | 1/1970 | Janning | 317/235 |
| 3,519,999 | 7/1970 | Gregor | 340/173 |
| 3,543,032 | 11/1970 | Kazan | 250/211.3 |
| 3,789,216 | 1/1974 | Komp | 250/211 R |
| 3,825,807 | 7/1974 | Wolf | 357/30 |

OTHER PUBLICATIONS

Kaufman, I.B.M. Tech. Discl. Bull., vol. 19, No. 1, June 1976, pp. 367–368.

Primary Examiner—Martin H. Edlow
Attorney, Agent, or Firm—Michael J. Striker

[57] ABSTRACT

The invention relates to a photo-sensitive solid-state electronic device whose anode-cathode current is modified by photon induced changes in the electrical condition of a dielectric layer on the semiconductor body. The invention is primarily concerned with the nature of the photosensitive material used for the device which is chosen to cause charge injection into the dielectric layer. The semiconductor body may define a FET, an MIS or a CCD device and the photosensitive material is conveniently an optically active organic dyestuff.

10 Claims, 1 Drawing Figure

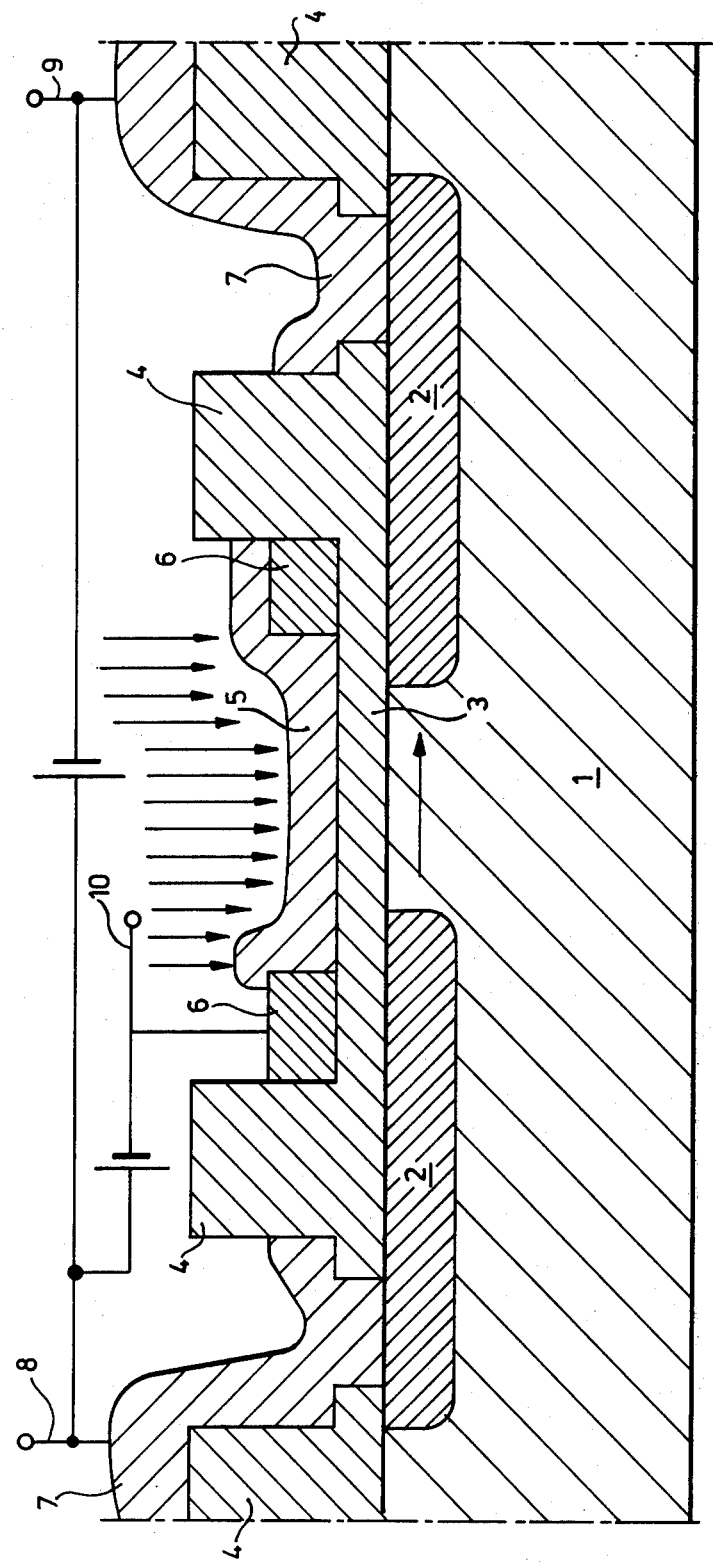

SEMICONDUCTOR DEVICE

This invention relates to a photo-sensitive solid-state electronic device whose anode-cathode current is modified by photon induced changes in the electrical condition of a dielectric layer, or layers, in which the modulating field is developed. It is, for example, applicable to devices of the type known as field-effect transistors or to field-effect diodes.

In the field-effect transistor structure the anode and cathode are known as the source and drain and it is known to modulate the channel conductance of such a device by altering the electrical condition of a dielectric layer in the device. It has previously been proposed to modify the electrical condition of the dielectric layer by collecting charge injected by tunnelling from the adjacent semiconductor body into the dielectric layer either in the vicinity of a "floating" electrode (a FAMOS device) or at an interface formed between two components of the dielectric layer (a MNOS device).

In the specification of U.K. Pat. No. 1,287,353 there is described a field-effect transistor comprising a semiconductor body overlain by a dielectric comprising two stacked layers — the layer adjacent to the body being of non-photoconductive insulating material and the outer layer being of a material which becomes conductive on illumination by a light source. For the device described in U.K. Pat. No. 1,287,353 to operate at all it is necessary for the outer layer to become conductive and the more conductive it becomes the better the device described performs. Typical of the photo-conductive layers proposed are cadmium sulphide, pure selenium, polycrystalline silicon and germanium and photoconductive glasses. On irradiation of the outer dielectric layer by the light source, charges are induced in the photoconductive layer and those of one particular polarity accumulate at the interface between the two stacked layers and modify the conduction within the semiconductor body so long as the irradiation continues. When the light source is extinguished, the residual charge in the photoconductive layer rapidly leaks away and the device reverts to its original state.

We have now found that a semiconductor device of improved performance can be obtained by using in place of a photoconductive layer, a photosensitive material disposed on and/or in a dielectric layer which photosensitive material has the ability to inject charges across the interface(s) into the dielectric layer and optionally also to give rise to a photo voltaic effect. Throughout this specification the term "charge injecting photosensitive material" will be used to signify such materials.

By relying on the injection of charges across the or each interface, devices in accordance with the invention have desirable properties and features. In particular, since the charges are injected into the electrically insulating layer, there is a much greater delay between termination of the illumination producing the electrical change in the semiconductor body and the disappearance of the change so produced, than is the case in a device such as described in U.K. Pat. No. 1,287,353, where the photon-induced charges are left in the photoconductive material to rapidly leak away when the illumination ceases.

According to one aspect of the invention a semiconductor device comprises a semiconductor body, a first electrode and a second electrode in or on said body between which a channel current can flow in a region of the body adjacent to a surface thereof, a dielectric layer on at least a part of said surface, a charge injecting photosensitive material (e.g. a dye) on said dielectric layer, the charge injecting photosensitive material (which must be positioned where it can be contacted by incident photons) being adjacent to an auxiliary electrode which, when the device is illuminated and electrically biased in an appropriate way, will cause charge injection into the dielectric layer to modify the electrical condition of the dielectric layer and affect the channel current flowing in the semiconductor body.

The charge injecting photosensitive material may be, for example, an optically-active dyestuff such as phthalocyanine, pinacyanole, kryptocyanine, crystal violet, methylene blue, phenosafranine or nitrosobenzene. It should be realised, however, that it is expected that a wide range of materials (which may or may not be already available for other applications) will be suitable for use in association with the dielectric layer as charge injecting photosensitive materials in a device in accordance with the invention. The dye-stuffs mentioned above are given by way of example and without intention to limit the invention thereto.

The semiconductor body is suitably n- or p- type silicon and the channel current can flow in a region of the body adjacent to the surface thereof from a doped area of one conductivity type (the source, say), through the body of opposite conductivity type to a further doped area of said one conductivity type (the drain, say). The first and second electrodes can then make low resistance contacts with the doped areas (source and drain) which areas give rise to a p-n (and n-p) junction in the current path between these electrodes. Where these junctions meet the surface they are overlain by the dielectric layer (e.g. an oxide or an oxide-nitride layer) which may, in turn, be overlain by the charge injecting photosensitive layer which is contacted by the auxiliary electrode(s) (e.g. in the form of a conducting grid).

The charge injecting photosensitive material will be excited in a frequency dependent manner, radiation of the appropriate wavelength generating carriers in the material (i.e. affording it enchanced electrical conductivity) and, under the influence of an appropriate positive or negative electrical field created by the auxiliary electrode(s), causing carrier injection (optionally by the influence of the photo voltaic effect on the potential of the auxiliary electrode) which modifies the electric field in the dielectric layer and thereby affects the channel current flowing in the semiconductor body.

Suitably the dielectric layer, sandwiched between the charge injecting photosensitive layer and the semiconductor body, is up to 10 microns thick (e.g. within the range 01.0 to 10 microns) and typically is between 0.025 and 2 microns thick. The two junctions, which in one embodiment form the source and drain regions, define the channel current path, and may typically be from 1 to 10 microns apart (although channel current paths up to 100 microns and above are not excluded). The electrical connections to the first and second electrodes can be made at any convenient place.

One embodiment of a device in accordance with the invention employing a field-effect structure is illustrated, by way of example, in the accompanying schematic drawing.

In the drawing 1 represents a body of semiconducting material and 2 represents areas doped with impurities of opposite type (source or drain, depending upon polarity) to the doping impurity of the body 1. 3 designates a thin layer of dielectric material or materials and 4 indicates regions of dielectric which may be thicker as required. A charge injecting photosensitive layer is indicated at 5 and this makes electrical contact with a grid 6 of electrically conducting material to which an auxiliary electrode 10 is attached. The regions 7 show contact areas to the source and drain, through which external electrodes 8 and 9 are contacted.

In operation of the device illustrated, the channel current is at leakage levels due to a reverse biased p-n (or n-p) junction between 1 and 2. Illumination of the layer 5 at the correct frequency will result in either electrons or holes being injected into the thin dielectric layer 3. In the simple structure shown in the drawing, the carriers will be trapped in the dielectric and "invert" the channel to make it conducting (i.e. convert it to an ON-state if sufficient charge is injected). This operation can be considered as "enhancement". Although the above explanation refers to the "injection" of charges it will be appreciated that in practice the change in electrical condition of the dielectric will also (to a greater or less extent) depend on the concomitant appearance of a photon-induced potential difference across the charge injecting photosensitive material/dielectric layer interface).

If now the layer 5 is illuminated with light of a different wavelength, so as to inject carriers of opposite sign into the dielectric layer 3, the previously injected charge will be neutralised and the device will then revert to its non-conducting (or OFF-state). This operation can be considered as "depletion".

In other embodiments of device in accordance with the invention, the dielectric layer(s) may have embedded within it (or them) an isolated semiconductor (typically silicon) electrode (the FAMOS structure) or the dielectric may consist of a layer of nitride on top of an oxide (MNOS structure). In the former case the injected charge would be stored mainly on or near the "floating" semiconductor electrode; in the latter case it would be stored mainly at or near the oxide-nitride interface. There are other methods of enhancing the effect of the injected charge, e.g. a dispersion of small metal particles (typically 20-50 Angstrom) in the dielectric layer(s). The invention includes all such structures.

Devices in accordance with this invention could be fabricated by any of the well-known methods of metal-insulator-semiconductor (M.I.S.) or metal-oxide-semiconductor (M.O.S.) technology, including the silicon-gate type of process currently used in FAMOS device manufacture. The only special feature would be the deposition of the charge injecting photosensitive layer. This could be achieved by a variety of techniques depending upon the chemical and physical properties of the charge injecting photosensitive layer and on the stage of manufacture at which this layer is deposited. For example — spinning of a concentrated solution of dye(s) in a volatile solvent (as in the deposition of photoresist films); sedimentation of the dyestuff(s) from a colloidal suspension in a volatile solvent; d.c. or a.c. sputtering; evaporation in vacuo, sublimation or deposition from solution. The charge injecting photosensitive layer may consist of a dispersion of organic material in a suitable matrix. The matrix must be chemically compatible with the manufacturing process. There are many materials or combinations of materials from which the matrix may be composed; as an example, it could be a gell or an organic polymer or a plastics material such as Perspex (RTM), but there are many other possibilities and the above example does not limit the invention thereto. The electrical properties of the matrix may be modified as necessary by, for example, the addition of metallic particles. Standard methods of masking would normally be used. If necessary the complete device (or an array of devices) could be enclosed in an hermetic or vacuum tight envelope with an optical window over the optically-active area, or it could be encapsulated in a transparent medium.

The invention has been described in the context of a device based on silicon technology in which the dielectric layer is typically composed of silicon dioxide or silicon nitride or a combination of these. The invention is also applicable, however, to any semiconductor field-effect device in which the conductance can be modulated by charges stored in the dielectric layer. The dielectric could be composed of any suitable insulator(s).

For the purpose of illustration, the application to a bistable solid-state switch has been described in which the channel conductance of the device illustrated is changed from a non-conducting OFF-state to a conducting ON-state, or vice versa, by a controlled variation of the charge stored in or on the dielectric by direct charge injection, optionally aided by a photo-voltaic effect. The invention is also applicable, however, to devices in which a gradual or continuous modulation in conductance is desired.

A device in accordance with the invention has the following advantages.

a. By controlled variation of the intensity of illumination, the electrical condition of a device may be changed from ON to OFF (e.g., as in a bistable switch) or it may be adjusted to continuously change the conductance of a device.
 b. In contrast to existing MOS or MIS devices the charge injection process in devices constructed according to the present invention can be reversed by a stimulus of the same form.
 c. Charge injection and consequent conductance modulation can be achieved without an avalanche breakdown of a p-n junction.
 d. The response of the charge injecting photosensitive layer can be made extremely sensitive to the wavelength of light (colour) and devices in accordance with the invention are applicable, therefore, to any chromatically responsive or selective devices or systems.
 e. By introducing suitable impurities, the properties of the dielectric layer 3 can be modified to match the photoresponse of a particular charge injecting photosensitive material. With an appropriate combination of dielectric and charge injecting photosensitive material which is sensitive to several wavelengths — whereby electrons are injected at some wavelengths and holes at other wavelengths (with or without assistance from a photo-voltaic effect) — the optical triggering stimuli can be adapted to suit particular applications.
 f. With appropriate charge injecting photosensitive materials, photon stimulated devices in accordance with the invention operating in the infra-red and/or the visible and/or the ultra-violet parts of the spectrum can be produced. An infra-red active device would be sensitive to thermal radiation.

The physics of carrier injection processes from the photosensitive layer 5 into the dielectric layer 3 is not well understood. Almost certainly, however, it involves the matching of electronic energy levels in the dielectric with optically excited electronic states in the charge injecting photosensitive material.

The origins of the photo-voltaic effect at the interfaces are also not throughly understood theoretically but they are well-known experimentally.

Improved systems, or sub-systems, can be designed using the unique properties of devices in accordance with the invention and these systems or sub-systems represent further aspects of the invention.

i. A memory system can be realised which uses the principle that optical modulation can be made selective for individual devices in an array. The transistor device illustrated in the drawing can be produced in high-density on a semi-conductor slice to implement for example, a memory in which "writing" is accomplished by a point source of light focused on a particular device. A suitable arrangement would involve scanning the matrix of devices with a time-base.

"Reading" or sensing the state of the device i.e. low or high channel conductance (OFF or ON), can be arranged by biasing or multiplexing all devices in parallel. The device addressed is a function of the scanning co-ordinate. Optical excitation could be achieved by laser beams. Methods of scanning laser beams are now available and this would offer extremely high packing densities of information storage devices.

ii. The density of information stored in a memory system (as outlined in 'i' above) could be increased by using a further property which may be manifest by a device in accordance with the invention; that the channel conductance is a continuous function of the magnitude of the stored charge and its distribution throughout the dielectric layer. This allows a memory system to be developed in which the optical beam used for "writing" is not only coded either to illuminate or not to illuminate a transistor storage cell, but coded as to the intensity of incident illumination. "Reading" the content of an addressed cell would involve decoding the magnitude of channel current flowing and not just a comparison with a fixed threshold value.

(iii) Photo-sensitive transistors in accordance with the invention could be used in a memory system in which a beam, used for scanning an array of the photo-sensitive transistors, contains information according to the frequency or colour of the light source (property d, above). Decoding would be accomplished by detection of the channel conductance value and a spectral characterisation of the transistor.

This technique could also be used in the construction of a colour-camera. Incident light from an objective lens could be fed, via a suitable scanning system, into individual transistor cells in accordance with the invention. The response of the charge injecting photosensitive layer to the incident beam in producing injection into the dielectric layer would alter the channel conductance, the value of conductance for any given transistor cell being a direct measure of the frequency of the incident light on that cell.

iv. A system used for optical pattern-recognition (O.P.R.) can be developed using devices in accordance with this invention. Properties b, and e, above allow the recognition process to be colour sensitive. A suitable system could utilise a fibre-bundle (a many-stranded fiber-optic cable) which focuses the incident light on to an array of photo-semiconductor devices in accordance with the invention. Parallel decoding of all of the array devices would be preferable before the incident light pattern could be used for reading typed script, or patterns, for example, and distinguishing between different shapes and colours and combinations of these.

v. An array of photosensitive semiconductor devices in accordance with the invention could be used as a sensor in a data-transmission system using fiber optics. The receiving end of the transmission link could use a fibre cable which focuses the signal onto the photosensitive devices. The response of the sensor, in terms of the change in conductance of each individual device, is a function of the optical properties of the charge injecting photosensitive material of that device. Therefore it is expected that the invention could be used in systems of various frequencies; the sensor response being as a result of the choice of charge injecting photosensitive material(s) and the design of the photosensitive device.

vi. Devices according to the invention could be fabricated and used in systems incorporating conventional field-effect devices of similar technology. They could be on a common semiconducting-substrate or hybrids. This provides direct coupling between optical systems and the electronic systems. A useful example would involve a photosensitive semi-conductor device in accordance with the invention, being used as the first stage of a charge-coupled device (C.C.D.). This would allow an optical input to an electronic shift-register, for example. Depending upon the intensity of the incident-beam the semiconductor surface may "invert" providing a source of minority carriers which are injected into the "potential well" of an adjacent C.C.D. stage.

Such an interaction could occur with other semi-conductor structures where an optical signal is the input to an electronic system. Photosensitive devices in accordance with the invention could be coupled in series and/or parallel to provide a simple logic operation at the input of the electronic system.

vii. An array of devices in accordance with the invention can be used to measure accurately the position of an incident beam. The divergence or convergence of the beam, and/or its intensity distribution, can also be measured in this way.

What is claimed is:

1. A bistable illumination-sensitive switch device comprising a semiconductor body, a first electrode and a second electrode in or on said body between which a channel current can flow in a region of the body adjacent to a surface thereof, a dielectric layer on at least a part of said surface, a charge injecting photosensitive material on said dielectric layer having the ability to inject charges into said dielectric layer, the charge injecting photosensitive material being adjacent to an auxiliary electrode which, while the device is illuminated and electrically biased in an appropriate way will cause charge injection into the dielectric layer to modify the electrical condition of the dielectric layer and affect the channel current flowing in the semiconductor body after the illumination ceases.

2. A device as defined in claim 1, in which the potential on the auxiliary electrode which is employed to inject carriers from the charge injecting photosensitive material into the dielectric layer, arises from the photovoltaic effect.

3. A device as claimed in claim 1, in which there is used as the charge injecting photosensitive material a substance selected from phthalocyanine, pinacyanole, kryptocyanine, crystal violet, methylene blue, phenosafranine and nitrosobenzene.

4. A device as claimed in claim 1, in which the semiconductor body is of silicon and the channel current is made to flow in a region of the body adjacent to a surface thereof from a doped area of one conductivity type through the body of opposite conductivity type to a further doped area of said one conductivity type, the first and second electrodes making low resistance contacts with the doped areas which areas give rise to a p-n junction and an n-p junction in the current path between these electrodes.

5. A device as claimed in claim 4, in which the junctions meet the surface and are there overlain by a dielectric layer chosen from $SiO_2$ and/or $Si_3N_4$.

6. A device as claimed in claim 7, in which the dielectric layer is overlain by the charge injecting photosensitive material and the layer of charge injecting photosensitive material is contacted by a conducting grid forming the auxiliary electrodes.

7. A semiconductor device as claimed in claim 1, in which the semiconductor body defines a field-effect-type device.

8. A semiconductor device as claimed in claim 1, in which the semiconductor body defines a metal-insulator-semiconductor-type (MIS) device.

9. A semiconductor device as claimed in claim 1 in which the charge injecting photosensitive material comprises at least one charge injecting photosensitive agent incorporated in an inert matrix chosen from plastics or polymer material.

10. A semiconductor body, a first electrode and a second electrode in or on said body between which a channel current can flow in a region of the body adjacent to a surface thereof, a dielectric layer on at least a part of said surface, a charge injecting photosensitive material on said dielectric layer having the ability to inject charges into said dielectric layer, the charge injecting photosensitive material being adjacent to an auxiliary electrode which, while the device is illuminated and electrically biased in an appropriate way causes charge injection into the dielectric layer producing a modification of the electrical condition of the dielectric layer and accordingly of the channel current flowing in the semiconductor body persisting indefinitely after the illumination ceases.

* * * * *